(12) United States Patent
Lal et al.

(10) Patent No.: US 10,158,063 B2
(45) Date of Patent: Dec. 18, 2018

(54) MONOLITHIC PZT ACTUATOR, STAGE, AND METHOD FOR MAKING

(71) Applicant: CORNELL UNIVERSITY, Ithaca, NY (US)

(72) Inventors: Amit Lal, Ithaca, NY (US); Sachin Nadig, Ithaca, NY (US); Serhan Mehmet Ardanuc, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 260 days.

(21) Appl. No.: 14/785,442

(22) PCT Filed: Apr. 18, 2014

(86) PCT No.: PCT/US2014/034620
§ 371 (c)(1),
(2) Date: Oct. 19, 2015

(87) PCT Pub. No.: WO2014/172617
PCT Pub. Date: Oct. 23, 2014

(65) Prior Publication Data
US 2016/0072041 A1 Mar. 10, 2016

Related U.S. Application Data

(60) Provisional application No. 61/813,498, filed on Apr. 18, 2013.

(51) Int. Cl.
*H01L 41/09* (2006.01)
*H01L 41/113* (2006.01)
(Continued)

(52) U.S. Cl.
CPC ...... *H01L 41/0933* (2013.01); *G01C 19/5755* (2013.01); *G01C 19/5769* (2013.01);
(Continued)

(58) Field of Classification Search
CPC ............ H01L 41/0933; H01L 41/0471; H01L 41/053; H01L 41/0953; H01L 41/096;
(Continued)

(56) References Cited

U.S. PATENT DOCUMENTS 2,373,431 A * 4/1945 Sykes .................. H03H 9/1014
310/366
3,487,239 A * 12/1969 Schafft .................. H01L 41/107
310/328

(Continued)

FOREIGN PATENT DOCUMENTS

JP 2009189194 8/2009

OTHER PUBLICATIONS

International Search Report and Written Opinion Form PCT/ISA/220, International Application No. PCT/US2014/034620, International Filing Date Apr. 18, 2014, pp. 1-14, dated Aug. 19, 2014.

*Primary Examiner* — Thomas Dougherty
(74) *Attorney, Agent, or Firm* — Bond, Schoeneck & King, PLLC; Blaine Bettinger; William Greener (57) ABSTRACT

A monolithic, bulk piezoelectric actuator includes a bulk piezoelectric substrate having a starting top surface and an opposing starting bottom surface and a at least two electrodes operatively disposed on the bulk piezoelectric substrate consisting of at least two discrete electrodes disposed on either/both of the starting top surface and the starting bottom surface and at least one electrode disposed on the respective other starting bottom surface or starting top surface. A stage includes a base, at least two of the monolithic, bulk piezoelectric actuators disposed on the base, a movable platform disposed on the base, and a respective number of deformable connectors each having a first connection to a respective one of the piezoelectric actuators and a second connection to a respective portion of the movable (Continued)

platform. A method for monolithically making a monolithic, bulk piezoelectric actuator involves a direct write micropatterning technique.

19 Claims, 8 Drawing Sheets

(51) Int. Cl.

| | | |
|---|---|---|
| *H02N 2/10* | (2006.01) |
| *G01C 19/5755* | (2012.01) |
| *G01C 19/5769* | (2012.01) |
| *G01P 15/09* | (2006.01) |
| *H01L 41/047* | (2006.01) |
| *H01L 41/053* | (2006.01) |
| *H01L 41/332* | (2013.01) |
| *H01L 41/335* | (2013.01) |
| *H01L 41/29* | (2013.01) |
| *H02N 2/00* | (2006.01) |

(52) U.S. Cl.
CPC ...... *G01P 15/0922* (2013.01); *H01L 41/0471* (2013.01); *H01L 41/053* (2013.01); *H01L 41/096* (2013.01); *H01L 41/0953* (2013.01); *H01L 41/113* (2013.01); *H01L 41/1132* (2013.01); *H01L 41/29* (2013.01); *H01L 41/332* (2013.01); *H01L 41/335* (2013.01); *H02N 2/0095* (2013.01); *H02N 2/108* (2013.01)

(58) Field of Classification Search
CPC .... H01L 41/113; H01L 41/1132; H01L 41/29; H01L 41/322; H01L 41/335; G01C 19/5755; G01C 19/5769; G01P 15/0922; H02N 2/0095; H02N 2/108
USPC ............ 310/311, 323.17, 328, 333, 365–369
See application file for complete search history.

(56) References Cited

U.S. PATENT DOCUMENTS

| | | | | |
|---|---|---|---|---|
| 4,019,073 | A * | 4/1977 | Vishnevsky | H01L 41/0913 310/322 |
| 5,043,621 | A * | 8/1991 | Culp | H01L 41/0913 310/316.02 |
| 6,327,120 | B1 * | 12/2001 | Koganezawa | G11B 5/5552 310/311 |
| 6,909,221 | B2 | 6/2005 | Ayazi et al. | |
| 7,459,834 | B2 * | 12/2008 | Knowles | H01L 41/0993 310/323.02 |
| 9,705,425 | B2 * | 7/2017 | Petrenko | H02N 2/0095 |
| 2004/0244167 | A1 | 12/2004 | Kitagawa et al. | |
| 2006/0290236 | A1 * | 12/2006 | Ikehashi | G01C 19/5719 310/330 |
| 2007/0252477 | A1 * | 11/2007 | Uchino | H01L 41/0933 310/328 |
| 2007/0252485 | A1 | 11/2007 | Kawakubo et al. | |
| 2010/0045142 | A1 | 2/2010 | Pulskamp et al. | |
| 2010/0245966 | A1 * | 9/2010 | Yasuda | G02B 26/0858 359/224.1 |
| 2013/0188282 | A1 * | 7/2013 | Zhang | H01L 41/0993 360/234.3 |
| 2013/0208330 | A1 * | 8/2013 | Naono | G02B 26/10 359/200.1 |
| 2016/0211439 | A1 * | 7/2016 | Najafi | H01L 41/0825 |

* cited by examiner

TOP VIEW

LATERAL BIMORPH ACTION

FIG. 1
CONTINUED (a)
NICKEL ☐
PZT ▨

(b)
NICKEL ☐
PZT ▨

(c)
NICKEL ☐
PZT ▨

MONOLITHIC PZT ACTUATOR, STAGE, AND METHOD FOR MAKING

RELATED APPLICATION DATA

The instant application claims priority to U.S. provisional application Ser. No. 61/813,498 filed Apr. 18, 2013, the subject matter of which is incorporated herein by reference in its entirety.

GOVERNMENT FUNDING

This invention was made with government support under grant number W31P4Q-12-1-0003 awarded by the U.S. Army. The government has certain rights in the invention.

BACKGROUND

Aspects and embodiments of the invention are generally directed to piezoelectric actuators, precision moveable stages utilizing the piezoelectric effect, and methods for making the piezoelectric actuators and, more particularly, to monolithic bulk-piezoelectric actuators, precision moveable stages utilizing the monolithic bulk-piezoelectric actuators, and methods for making the monolithic bulk-piezoelectric actuators using direct-write micro-patterning techniques.

Precision piezoelectric stages for linear and rotary motion have proven to be of great value in areas that require accurate and precise positioning and calibration. Ultrasonic motors and piezoelectric actuators utilize actuator constructs such as bimorphs, unimorphs, and shear tubes made of piezoelectric materials such PZT (Lead Zirconate Titanate Oxide).

Piezoelectric materials undergo a change in shape by extension or compression depending on poling directions and electrodes used to provide charges that develop an electric field across the piezoelectric materials. Bimorph actuation is most commonly used to maximize displacement in piezoelectric actuators. Most commercially available bimorphs are made of ceramic piezoelectric materials with thicknesses ranging from 10s of microns to a few millimeters. These piezoelectric materials are often referred to as bulk piezoelectric materials. These actuators are macro-scale, millimeter in thickness, and centimeter in width and length, and are often designed by gluing multiple layers, making them mostly unsuitable for integration in microsystems, where many actuators are required within volumes of $mm^3$ to 1 $cm^3$. Manual assembly of many of these large devices and/or special attention to polarization directions are required for large displacements, which does not lead to small systems, as the manual assembly techniques generally preclude precision placement and repeatable performance across different assembled actuators in one assembly.

Alternatively, thin film MEMS unimorphs and bimorphs use micron-thick piezoelectric material (e.g. PZT, AlN, ZnO) that can result in actuator arrays that can be made in small volumes, in a monolithic manner. Typical thicknesses for the active piezoelectric layer that can be achieved range from nanometers to 10s of microns. The amount of mechanical energy generated by the piezoelectric actuator is proportional to its volume. Hence, the thickness of these structures is too small to produce sufficient forces. Therefore, there is a need for developing thicker piezoelectric actuators, monolithically, to create repeatable, and matched actuators. In light of these shortcomings, others have tried to form monolithic piezoelectric actuators with bulk piezoelectric materials. For example, Aktakka et al. (A 3-DOF piezoelectric micro vibratory stage based on bulk-PZT/silicon crab-leg suspensions, *IEEE MEMS.* 2013) first polished PZT plates, bonded them to silicon substrates, and then wet etched them to form structures in PZT and silicon. As another example, Kommepalli et al. (Piezoelectric T-beam actuators, *ASME J. Mechanical Design*, vol. 133, 061003, pp. 1-9, 2011) cut PZT plates using a dicing saw and dry etching to obtain T-structures with six (3 on top and 3 on bottom) electrodes on one beam. This reference develops a structure that enables in-plane and out-of-plane actuation. The dry etching approach requires lithographic patterning and a mask layer. These steps are time-consuming and costly due to the plasma generation system, cost of the gases used, and the need for a cleanroom to manufacture the actuators. It would be cost-effective and commercially attractive to develop a maskless patterning and etching technique in one, to develop and fabricate monolithic piezoelectric actuator arrays. In addition, one can develop approaches to tune the structures for perfect matching across actuators in the same fabrication process.

Focused laser beams are regularly used to cut and drill (laser-micromachining) into ceramic plates including PZT plates. The incorporation of laser cutting to realize planar structures is therefore an attractive method to achieve low-cost, out-of-cleanroom fabrication of actuator arrays.

For the specific application of implementing a motion stage, one often needs to develop pure motion only in one direction. For example, one desires pure rotation or pure linear motion in two directions. If one actuates in one direction, it should lead to minimal motion in the other directions. At the same time one desires to maximize the motion of the stage for a given drive voltage. In the case of a rotary motion, the in-plane motion due to lateral bimorphs generates bending at the interface of the actuators to the stage, which also excites shear motion if directly connected to a rotary stage. Hence, realization of a pure rotary dither motion is a technical challenge not addressed before, and its enablement would be beneficial.

In addition to the actuators, it is often desirable to include capacitors near the stage for buffering and filtering electronic signals. For some electronic sensors and actuators one often needs passive electrical components such as capacitors, resistors, and inductors. It would be advantageous and beneficial to be able to form these components directly, monolithically in PZT using direct write micropatterning.

Piezoelectric devices also include piezoelectric gyroscopes, accelerometers, and energy harvesters. It would be advantageous and beneficial to be able to form these components directly, monolithically in a PZT, co-fabricated with the motion stage, using direct write micropatterning, with the lateral actuator as the elemental component.

In view of the aforementioned shortcomings and problems associated with conventional unimorph and bimorph piezoelectric actuators, and existing approaches to monolithic actuation, the inventors have recognized the advantages and benefits to be realized by addressing these challenges and solving these problems, many of which are realized by the embodied invention directed to monolithic bulk-piezoelectric actuators, precision moveable stages utilizing the monolithic bulk-piezoelectric actuators, and methods for making the monolithic bulk-piezoelectric actuators using direct-write micropatterning techniques, as disclosed and claimed herein below.

Definitions as Used Herein

The term 'bulk piezo' as it refers to a material or a substrate means a commercially available piezoelectric (PZT) plate having deposited electrodes on two opposing surfaces thereof.

The term 'starting top surface' means a top electrode-deposited surface of the bulk piezoelectric material or substrate; the term 'starting bottom surface' means a bottom electrode-deposited surface of the bulk piezoelectric material or substrate.

The term 'monolithic' means a single piece as, for example, the bulk PZT including the deposited electrodes is a monolithic piece, whereas two or more monolithic pieces clamped or bonded together is not considered monolithic as used herein.

The term 'plurality of monolithic, contiguous segments' means a monolithic plurality of continuous segments oriented in a non-linear manner; e.g., like a 'potato peel.'

The term 'in-plane' means in the plane containing the length, L, dimension of the monolithic PZT actuator.

The term 'about' means the amount of the specified quantity plus/minus a fractional amount (e.g., ±10%, ±9%, ±8%, ±7%, ±6%, ±5%, +4%, ±3%, ±2%, ±1%, etc.) thereof that a person skilled in the art would recognize as typical and reasonable for that particular quantity or measurement.

The term 'substantially' means as close to or similar to the specified term being modified as a person skilled in the art would recognize as typical and reasonable; for e.g., within typical manufacturing and/or assembly tolerances, as opposed to being intentionally different by design and implementation or. For example, the claimed term " . . . an operative condition of substantially only in-plane motion" means measurable in-plane motion and de-minimus, if any, out-of-plane motion.

SUMMARY

An aspect of the invention is a monolithic piezoelectric actuator. In an embodiment, the piezoelectric actuator includes a bulk piezoelectric substrate having a starting top surface and an opposing starting bottom surface; and a plurality of electrodes operatively disposed on the bulk piezoelectric substrate consisting of a plurality of discrete electrodes disposed on at least one of the starting top surface and the starting bottom surface and at least one electrode disposed on the at least one of the respective starting bottom surface and the starting top surface. According to various exemplary, non-limiting embodiments, the piezoelectric actuator may include the following additional features, limitations, and/or characteristics, alone or in combination:

wherein the piezoelectric actuator is characterized by an operative condition of substantially only in-plane motion;
  wherein the piezoelectric actuator is characterized by a width, W, a height, H, and a length, L, where W is less than or about equal to H to enable high aspect ratio piezoelectric beam structures;
    wherein the piezoelectric actuator is comprised of a plurality of monolithic, contiguous segments, each next adjoining segment of which has an in-plane orientation along the length, L, that is different than that of its respective prior segment by between greater than zero degrees to ±90 degrees;
    wherein the piezoelectric actuator has a curvilinear length dimension;
  wherein the bulk piezoelectric substrate has at least one intermediate surface;
    wherein the bulk piezoelectric substrate is asymmetric in the H direction;
    wherein the bulk piezoelectric substrate is characterized by an operative condition comprising an out-of-plane twisting motion.

An aspect of the invention is a method for monolithically making a piezoelectric actuator. In an embodiment, the method includes the steps of providing a bulk piezoelectric (PZT) material that includes an electrode disposed on a starting top surface thereof and on an opposing starting bottom surface thereof; and using a direct write micropatterning technique to remove at least a portion of the electrode on at least one of the starting top surface and the starting bottom surface, such that the monolithic, bulk PZT material comprises a plurality of electrodes consisting of a plurality of discrete electrodes on the at least one of the starting top surface and the starting bottom surface and at least one electrode on the at least one of the respective starting bottom surface and the starting top surface. According to various exemplary, non-limiting embodiments, the method may include the following additional steps, features, limitations, and/or characteristics, alone or in combination:

wherein the direct write (maskless) micropatterning technique includes at least one of laser micromachining, water-jet drilling, ultrasonic drilling, electrical discharge machining, laser-assisted etching, and micro-CNC machining;
  further comprising removing at least a portion of at least one of the non-electrode containing starting top surface and the non-electrode containing starting bottom surface to form at least one non-electrode containing intermediate surface;
    comprising forming asymmetric intermediate surfaces in the respective non-electrode containing regions of the starting top surface and the starting bottom surface;
  comprising forming the monolithic piezoelectric actuator into a beam shape in a length, L, direction characterized by a width, W and a height, H, where W is less than or about equal to H and W, H<<L;
  comprising forming the monolithic piezoelectric actuator into a plurality of monolithic, contiguous segments, each next adjoining segment of which has an in-plane orientation along the length, L, that is different than that of its respective prior segment by between greater than zero degrees to ±90 degrees;
  comprising forming the monolithic piezoelectric actuator into a curvilinear shape along the length, L, direction.

An aspect of the invention is a stage. According to an embodiment, the stage includes a PZT base; a plurality of the piezoelectric actuators as described immediately herein above disposed on the base; a movable platform disposed on the base; and a plurality of deformable connectors each having a first connection to a respective one of the plurality of piezoelectric actuators and a second connection to a respective portion of the movable platform, wherein the stage is electrically controllable. According to various exemplary, non-limiting embodiments, the piezoelectric actuator may include the following additional features, limitations, and/or characteristics, alone or in combination:

wherein each of the plurality of the piezoelectric actuators are characterized by an operative condition of substantially only in-plane motion;
  wherein each of the plurality of the piezoelectric actuators are characterized by a width, W, a height, H, and a length, L, where W is less than or about equal to H;
    wherein each of the plurality of the piezoelectric actuators is comprised of a plurality of monolithic, contiguous segments, each next adjoining segment of which has an in-plane orientation along the length, L, that is different than that of its respective prior segment by between greater than zero degrees to ±90 degrees;

wherein each of the bulk piezoelectric actuators has a curvilinear length dimension;

wherein the bulk piezoelectric substrate of each of the plurality of the piezoelectric actuators has at least one intermediate surface;

wherein each of the bulk piezoelectric substrates is asymmetric in the H direction;

wherein each of the bulk piezoelectric substrates is characterized by an operative condition comprising an out-of-plane twisting motion;

wherein the moveable platform is PZT;

wherein the moveable PZT platform integrally comprises a monolithic, bulk PZT device;

wherein the monolithic, bulk PZT device is at least one of a sensor, a gyroscope, an accelerometer, and an energy harvester;

further comprising a monolithic, bulk PZT device mounted on the moveable platform;

wherein the monolithic, bulk PZT device is at least one of a sensor, a gyroscope, an accelerometer, and an energy harvester.

An aspect of the invention is a method for making a stage as described immediately herein above. The method includes the steps of providing a plurality of the piezoelectric actuators as described herein above; providing a moveable PZT platform; providing a respective plurality of deformable connectors each having a first connection to a respective one of the plurality of piezoelectric actuators and a second connection to a respective portion of the movable platform. According to various exemplary, non-limiting embodiments, the method may include the following additional steps, features, limitations, and/or characteristics, alone or in combination:

forming a monolithic, bulk PZT device in the moveable PZT platform.

It should be appreciated that all combinations of the foregoing steps, features, limitations, and/or characteristics, and additional aspects and embodiments discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE FIGURES

FIG. 1: (a) schematically shows the process flow used for fabricating a Bulk PZT bimorph; (b) shows an image of a fabricated 10 mm long, 0.45 mm wide, 0.5 mm thick bulk PZT bimorph for in-plane actuation; (c) schematically shows a top view of the bulk PZT bimorph unactuated (left) and actuated for lateral, in-plane deflection (right), according to illustrative embodiments of the invention.

FIG. 2: (a) shows a schematic cross sectional view of a monolithic piezoelectric actuator in which the non-electrode containing starting top surface has been direct write micropatterned to form a non-electrode containing intermediate surface; (b) shows a schematic cross sectional view of a monolithic piezoelectric actuator in which the non-electrode containing starting bottom surface has been direct write micropatterned to form a non-electrode containing intermediate surface; (c) shows a schematic cross sectional view of a monolithic piezoelectric actuator in which the non-electrode containing starting top surface and the non-electrode containing starting top surface have been direct write micropatterned to form non-symmetrical, non-electrode containing intermediate surfaces, according to illustrative aspects of the invention.

FIG. 6: a) Cross sectional view of capacitors formed by selective depolarization of PZT; b) Capacitor in use as part of the associated electronic circuitry, according to illustrative aspects of the invention.

DETAILED DESCRIPTION OF NON-LIMITING, EXEMPLARY EMBODIMENTS

Figure 1:
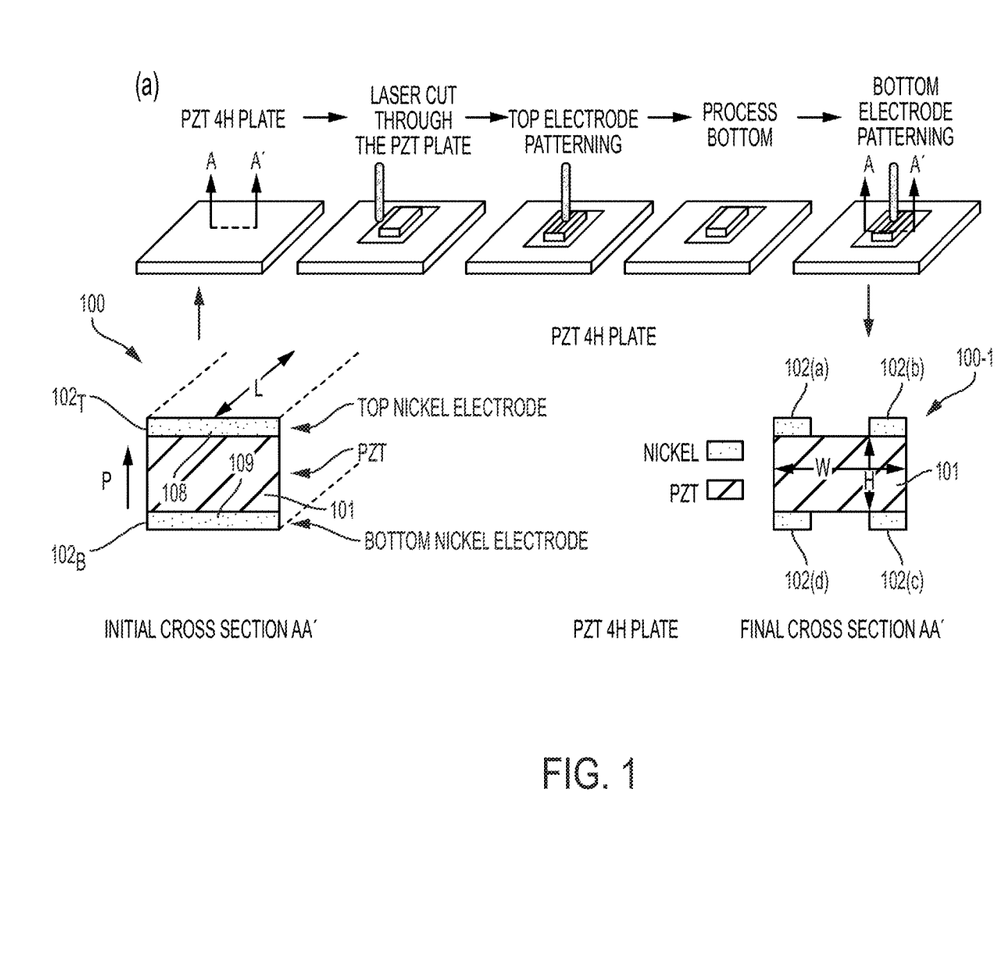

An embodiment of the invention is a monolithic, bulk piezoelectric actuator 100-1 capable of in-plane (lateral) motion with substantially no out-of-plane (transverse) motion, as illustrated, respectively, in FIGS. 1a and 1c. Referring to FIG. 1a, the bulk piezoelectric actuator 100-1 is derived from a commercially available bulk PZT and consists of a bulk PZT material 101 and electrodes $102_T$ and $102_B$ on top and bottom surfaces, respectively, of the bulk PZT material 101. FIG. 1a also schematically shows the process flow used for fabricating the monolithic, bulk PZT actuator 100-1 from the monolithic, bulk PZT plate 100.

As further illustrated in the lower left 'Initial Cross Section AA' diagram of FIG. 1a, the top and bottom electrodes $102_T$ and $102_B$ are provided on what are referred to as the starting top surface 108 and the starting bottom surface 109 of the bulk PZT plate 100. As further illustrated in the diagrams along the top of FIG. 1a, a direct write micropatterning technique is used on the bulk PZT plate 100 to remove a portion of the starting top surface electrode $102_T$ and a portion of the starting bottom surface electrode $102_b$, such that the monolithic, bulk PZT material 100 now comprises two discrete electrodes 102a, 102b on the starting top surface and two discrete electrodes 102c, 102d on the starting bottom surface resulting in monolithic, bulk PZT actuator 100-1.

It is to be appreciated that although two discrete electrodes on each of the starting top surface and the starting bottom surface are shown, the invention contemplates an operable monolithic, bulk PZT actuator having at least two discrete electrodes disposed on at least one of the starting top surface and the starting bottom surface and at least one electrode disposed on the other respective starting bottom surface and starting top surface. When there are no intermediate PZT surfaces (described further below) the embodied actuator exhibits substantially only lateral (i.e., in the plane of the length, L, direction) motion (see FIG. 1c) upon application of a voltage.

Further as illustrated in FIG. 1c, the monolithic, bulk PZT actuator is in the geometry of a beam; i.e., having a cross sectional width, W and Height, H, where W is less than or about equal to H, and a length, L, where L is much greater than W or H.

Referring again to FIG. 1a, it schematically illustrates a method for monolithically making a piezoelectric actuator. As shown from left to right, a bulk piezoelectric (PZT) material that includes an electrode disposed on a starting top surface thereof and on an opposing starting bottom surface thereof is provided. A direct write micropatterning technique is used to remove at least a portion of the electrode on at least one of the starting top surface and the starting bottom surface, such that the monolithic, bulk PZT material comprises a plurality of electrodes consisting of a plurality of discrete electrodes on the at least one of the starting top surface and the starting bottom surface and at least one electrode on the at least one of the respective starting bottom surface and the starting top surface. The direct write (maskless) micropatterning technique includes at least one of laser micromachining, water-jet drilling, ultrasonic drilling, electrical discharge machining, laser-assisted etching, and micro-CNC machining. The direct write technique allows precision removal of PZT and/or electrode material, optionally with double-side (top-bottom) alignment capability.

Electrical excitation of electrodes patterned on the PZT plate generates motion, whose direction and amplitude are controlled by the polarity and magnitudes of electrical potentials on the electrodes formed on the device. An advantageous feature of the embodied invention is that it allows monolithic fabrication of actuators from commercially available piezoelectric plates without any mask making, lithography, or electrode deposition step, all of which increase the time and cost of manufacture. Furthermore, the ability to double side align the electrodes can yield almost doubling of the actuator displacements in certain actuation arrangements, and allows more complex displacement vectors at the tip due to an additional electrode formed on the back side.

FIG. 1b shows an image of a fabricated 10 mm long, 0.45 mm wide, 0.5 mm thick bulk PZT bimorph (two electrodes top and bottom) for in-plane actuation.

Figure 2:
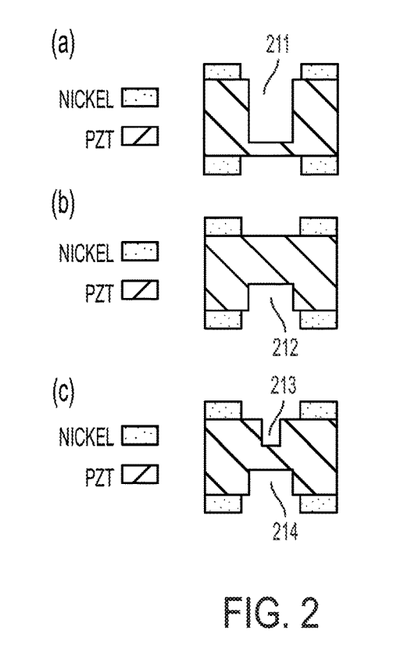

The direct write micropatterning technique can also be advantageously employed to created intermediate PZT material surfaces (211, 212, 213, 214, others) as illustrated in FIGS. 2(a, b, c). Depending upon the number of discrete electrodes on the starting top and bottom surfaces of the bulk PZT, the monolithic, bulk PZT actuators having symmetric or asymmetric, electrodeless intermediate surfaces can provide both controllable in-plane and/or out-of-plane (planar and/or twisting) motion(s) depending upon starting surface electrode number, sizes, and applied voltages. It will be appreciated that according to the embodied invention, electrodes are only disposed on the starting top and bottom surfaces and never on any of the intermediate PZT surfaces.

Figure 3:
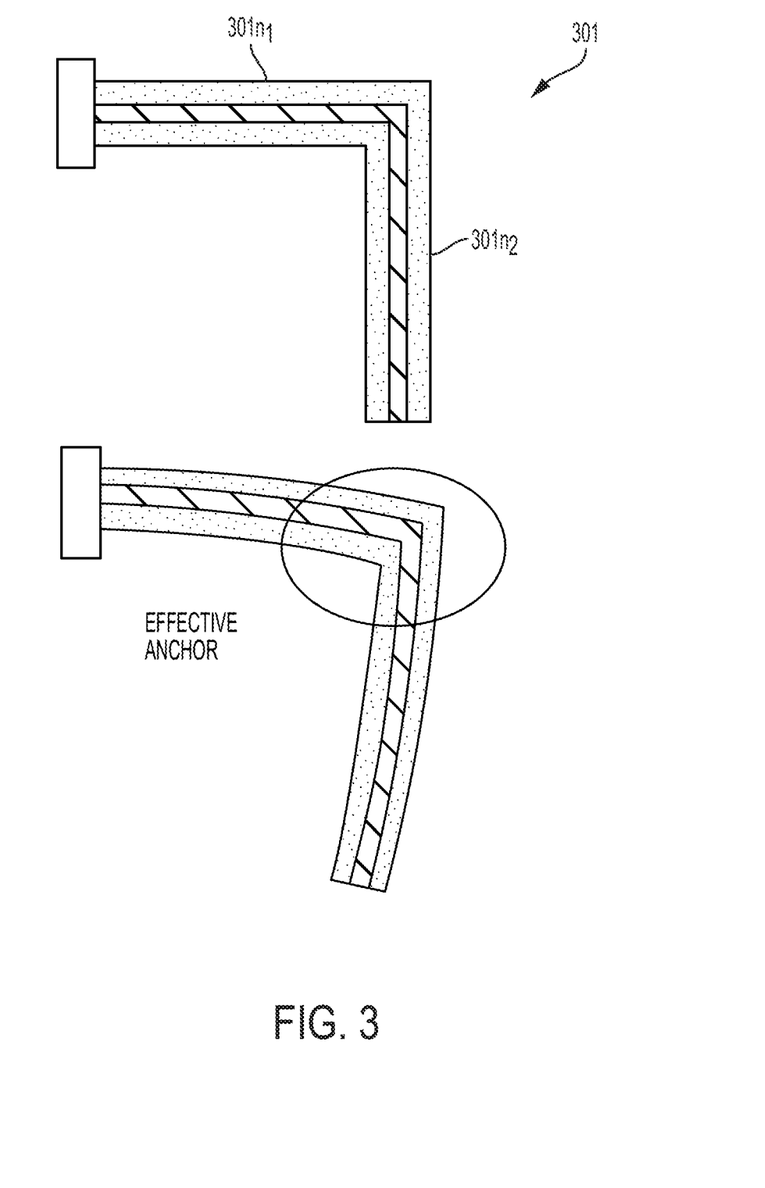
FIG. 3 schematically illustrates in a top view a two section monolithic, contiguous PZT bimorph in an unactuated (top) and an actuated (bottom) state for providing in-plane deflection, according to an illustrative aspect of the invention.

Still further advantageously as illustrated in FIG. 3, the monolithic, bulk PZT actuator 301 can be fabricated into a plurality of contiguous segments $301_n$ (two segments $301_{n1}$, $301_{n2}$ shown), such that when voltage is applied, the actuator experiences in-plane (plane of the paper) motion. As illustrated, subsequent segment $301_2$ is oriented (in-plane) at an angle of 90 degrees from preceding segment $301_1$; however, it is to be appreciated that the angle between adjoining contiguous segments can be any angle between greater than zero degrees to ±90 degrees. The plurality of segments may also proceed in a curve manner such as an in-plane 'potato peel' shape.

Figure 4:
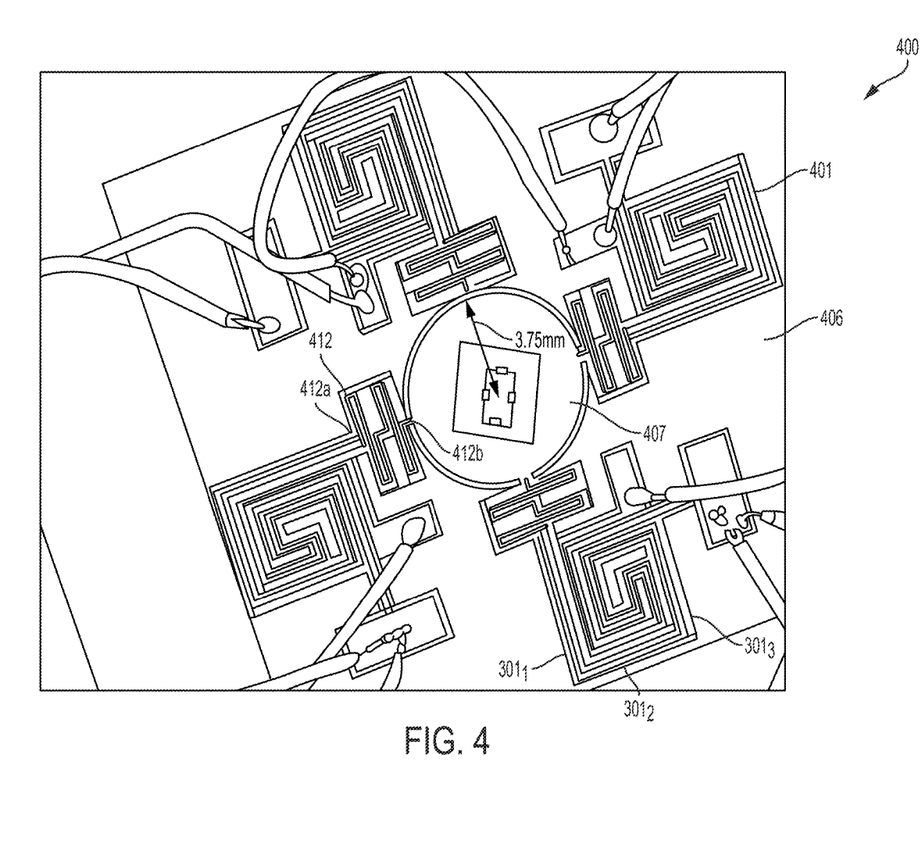
FIG. 4 shows a photograph of a stage comprising a base, a rotatable platform, four quadratically positioned monolithic, contiguous PZT bimorph actuators, and four respective springs each connected to an actuator and the rotatable platform, according to an exemplary embodiment of the invention. A device is shown mounted on the rotatable platform.

FIG. 4 shows a stage 400 that includes a base 406, a plurality (four shown) of multi-segment ($301_1$, $301_2$, $301_3$, etc.), monolithic, bulk PZT actuators 401 piezoelectric actuators disposed quadratically on and about the base, a movable platform 407 disposed on the base, and a plurality (four shown) of deformable connectors 412 each having a first connection 412a to a respective one of the plurality of piezoelectric actuators 401 and a second connection 412b to a respective portion of the movable platform 407. Electrode connections are also illustrated. The multi-segment, monolithic, bulk PZT actuators 401 can be of the no-intermediate surface type (FIG. 1) or of the electrodeless-intermediate surface type (FIG. 2).

Figure 5:
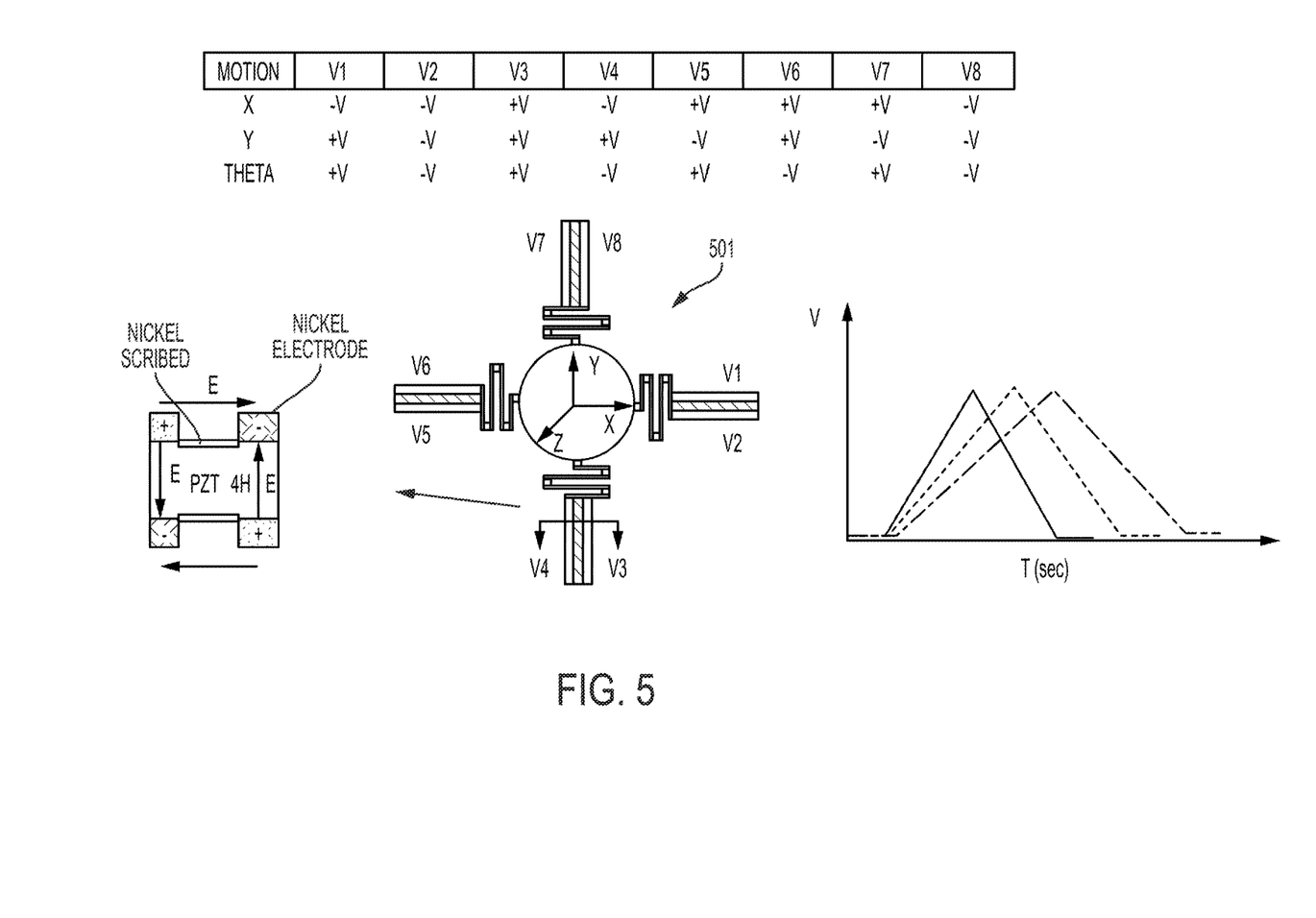
FIG. 5 schematically illustrates a four actuator stage (center), a cross sectional view of one of the monolithic PZT actuators comprising the stage (lower left), a table showing a positive or a negative voltage that can be applied to the numbered electrodes V1-V8 of the four PZT actuators to achieve a desired motion, and a graph showing angular and linear speeds of the actuators depending on the provided excitation, according to illustrative aspects of the invention.

FIG. 5 illustrates a stage 501 that schematically shows an actuator or actuator segment in cross section. The illustrated actuator or actuator segment has two electrodes each on the starting top and bottom surfaces of the bulk PZT and no intermediate surfaces. The table in FIG. 5 illustrates controllable motion control of the actuators and thus of the moveable platform by virtue of the voltage polarity applied to each of the electrodes.

Figure 6:
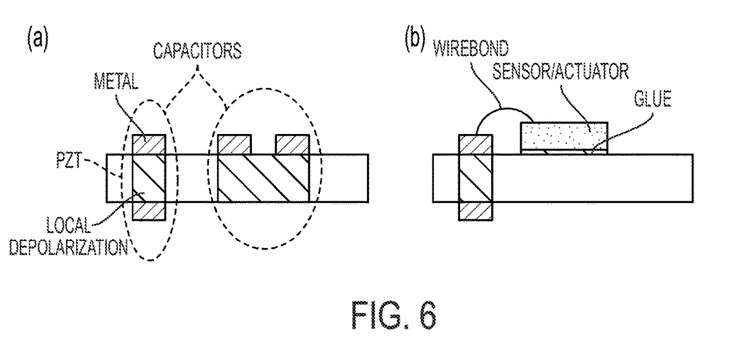

As mentioned hereinabove, it would be advantageous to integrate passive electrical components such as capacitors, resistors, and inductors into a device (e.g., sensor) mounted on or in the rotatable platform of the piezoelectric motion stage as embodied herein, for buffering and filtering electronic signals. FIG. 6a shows a cross sectional view of capacitors formed by selective depolarization of PZT. FIG. 6b similarly shows a capacitor in use as part of the associated electronic circuitry. The same direct write micropatterning technique and process flow as used for monolithically fabrication the embodied bulk, monolithic piezoelectric actuators can be used to form the electrical components.

Figure 7:
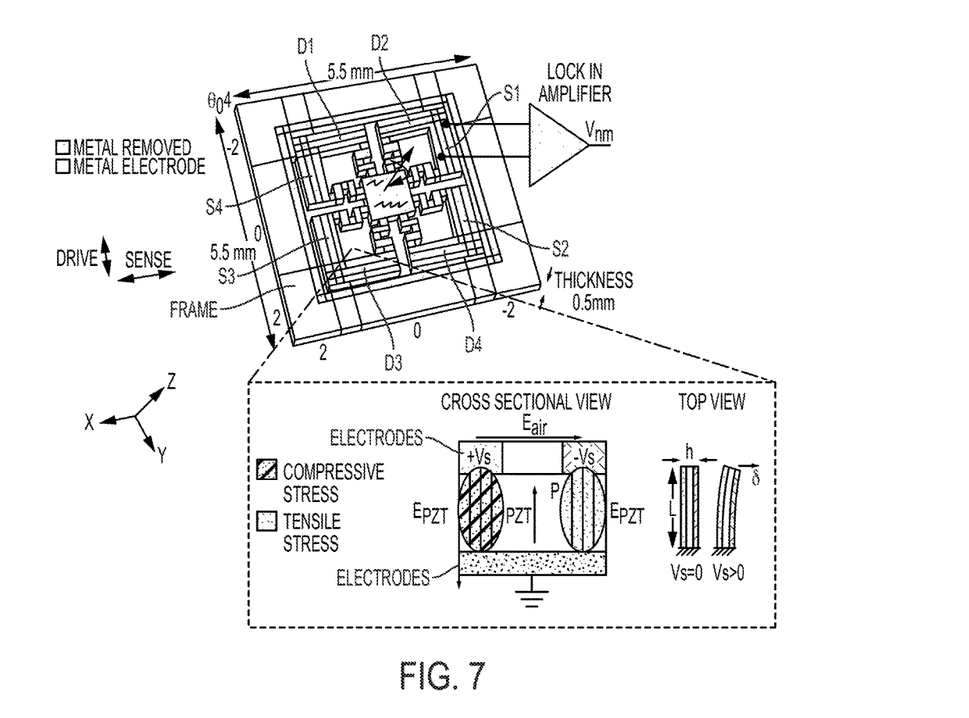
FIG. 7 schematically illustrates a monolithic, piezoelectric gyroscope design according to an illustrative aspect of the invention.
Figure 8:
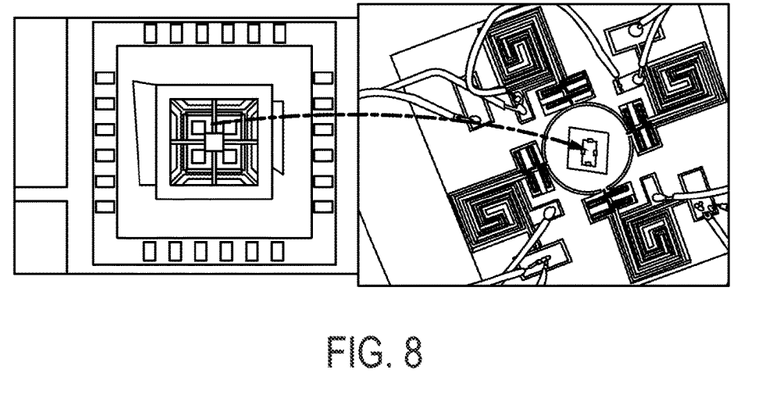
FIG. 8 shows a monolithically fabricated piezoelectric gyroscope (FIG. 7) placed in a DIP package (left), and mounting the piezoelectric gyroscope on the rotatable (dither) platform of the stage, according to illustrative aspects of the invention.

In addition to a sensor, one may wish to have a piezoelectric device, including but not limited to piezoelectric gyroscopes, accelerometers, and energy harvesters, mounted on or integrally formed in the rotatable platform of the motion stage. From cost and integration standpoints, it would be especially advantageous and beneficial to form these components directly, monolithically in a PZT material, co-fabricated with the motion stage, using direct write micropatterning, with the lateral actuator as the elemental component. FIG. 7 schematically illustrates an illustrative direct write micropatterned monolithic, piezoelectric gyroscope. FIG. 8 shows the monolithically fabricated gyroscope incorporated into a piezoelectric rotatable (dither) platform of the motion stage, as illustrated in FIGS. 4 and 5. Monolithic integration of a piezoelectric device on a stage suspended far from the stage's base also allows thermal isolation of the device. This is useful for thermal actuation and sensing applications of bulk-PZT, which relies on generation or sustaining of large temperature gradients between the stage's base and the device.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc. It should also be understood that, unless clearly indicated to the contrary, in any methods claimed herein that include more than one step or act, the order of the steps or acts of the method is not necessarily limited to the order in which the steps or acts of the method are recited. In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

We claim:

1. A monolithic piezo actuator, comprising:
   a bulk piezoelectric substrate having a starting top surface and an opposing starting bottom surface, and at least one intermediate surface; and
   a plurality of electrodes operatively disposed on the bulk piezoelectric substrate, consisting of:
   a plurality of discrete electrodes disposed on at least one of the starting top surface and the starting bottom surface and at least one electrode disposed on the at least one of the respective starting bottom surface and the starting top surface;
   wherein the piezoelectric actuator is characterized by an operative condition comprising an out-of-plane twisting motion.

2. The piezoelectric actuator of claim 1, characterized by an operative condition comprising an in-plane motion.

3. The piezoelectric actuator of claim 1, characterized by a width, W, a height, H, and a length, L, where W is less than or about equal to H to enable high aspect ratio piezoelectric beam structures.

4. The piezoelectric actuator of claim 3, wherein the piezoelectric actuator is comprised of a plurality of monolithic, contiguous segments, each next adjoining segment of which has an in-plane orientation along the length, L, that is different than that of its respective prior segment by between greater than zero degrees to +90 degrees.

5. The piezoelectric actuator of claim 1, wherein the bulk piezoelectric substrate is asymmetric in the H direction.

6. The piezoelectric actuator of claim 3, wherein the piezoelectric actuator has a curvilinear length dimension.

7. A stage, comprising:
a PZT base;
a plurality of the piezoelectric actuators of claim 1 disposed on the base;
a movable platform disposed on the base; and
a plurality of deformable connectors each having a first connection to a respective one of the plurality of piezoelectric actuators and a second connection to a respective portion of the movable platform,
wherein the stage is electrically controllable.

8. The stage of claim 7, wherein each of the plurality of the piezoelectric actuators are characterized by an operative condition of substantially only in-plane motion.

9. The stage of claim 7, wherein each of the plurality of the piezoelectric actuators are characterized by a width, W, a height, H, and a length, L, where W is less than or about equal to H.

10. The stage of claim 9, wherein each of the plurality of the piezoelectric actuators is comprised of a plurality of monolithic, contiguous segments, each next adjoining segment of which has an in-plane orientation along the length, L, that is different than that of its respective prior segment by between greater than zero degrees to +90 degrees.

11. The stage of claim 7, wherein the bulk piezoelectric substrate of each of the plurality of the piezoelectric actuators has at least one intermediate surface.

12. The stage of claim 11, wherein each of the bulk piezoelectric substrates is asymmetric in the H direction.

13. The stage of claim 11, wherein each of the bulk piezoelectric substrates is characterized by an operative condition comprising an out-of-plane twisting motion.

14. The stage of claim 9, wherein each of the bulk piezoelectric actuators has a curvilinear length dimension.

15. The stage of claim 7, wherein the moveable platform is PZT.

16. The stage of claim 15, wherein the moveable PZT platform integrally comprises a monolithic, bulk PZT device.

17. The stage of claim 16, wherein the monolithic, bulk PZT device is at least one of a sensor, a gyroscope, an accelerometer, and an energy harvester.

18. The stage of claim 7, further comprising a monolithic, bulk PZT device mounted on the moveable platform.

19. The stage of claim 18, wherein the monolithic, bulk PZT device is at least one of a sensor, a gyroscope, an accelerometer, and an energy harvester.

* * * * *